(12) United States Patent
Han et al.

(10) Patent No.: US 9,918,396 B2
(45) Date of Patent: Mar. 13, 2018

(54) BENDABLE STRUCTURE AND ELECTRONIC DEVICE

(71) Applicants: Beijing Lenovo Software Ltd., Beijing (CN); Lenovo (Beijing) Co., Ltd., Beijing (CN)

(72) Inventors: Xiaoqin Han, Beijing (CN); Beiou Luan, Beijing (CN)

(73) Assignees: Beijing Lenovo Software Ltd., Beijing (CN); Lenovo (Beijing) Co., Ltd., Beijing (CN)

( * ) Notice: Subject to any disclaimer, the term of this patent is extended or adjusted under 35 U.S.C. 154(b) by 131 days.

(21) Appl. No.: 14/978,637

(22) Filed: Dec. 22, 2015

(65) Prior Publication Data

US 2017/0048996 A1 Feb. 16, 2017

(30) Foreign Application Priority Data

Aug. 14, 2015 (CN) .......................... 2015 1 0501277

(51) Int. Cl.
*H05K 5/02* (2006.01)
*G06F 1/16* (2006.01)

(52) U.S. Cl.
CPC ......... *H05K 5/0217* (2013.01); *G06F 1/1681* (2013.01); *G06F 1/1616* (2013.01)

(58) Field of Classification Search
CPC .... G06F 1/1652; G06F 1/1681; G06F 1/1679; G06F 1/1626; G06F 2200/1633; G06F 1/1601; G06F 1/1616; H04M 1/0216; H04M 1/0268; H05K 5/0226; H05K 5/0217; E05D 3/06; E05D 3/10; E05D 7/00
USPC ............ 361/679.01, 679.02, 679.04–679.09, 361/679.21–679.3, 679.55–679.58; 455/575.1–575.4

See application file for complete search history.

(56) References Cited

U.S. PATENT DOCUMENTS

| | | | |
|---|---|---|---|
| 9,606,583 B2 * | 3/2017 | Ahn ...................... G06F 1/1681 |
| 9,625,947 B2 * | 4/2017 | Lee ....................... G06F 1/1616 |
| 2007/0117600 A1 * | 5/2007 | Robertson, Jr. ..... H04M 1/0216 | 455/575.3 |
| 2008/0018631 A1 * | 1/2008 | Hioki ................ G02F 1/133305 | 345/206 |
| 2010/0144406 A1 * | 6/2010 | Ozawa .................. G06F 1/1618 | 455/575.3 |

(Continued)

*Primary Examiner* — Steven T Sawyer
*Assistant Examiner* — Sagar Shrestha
(74) *Attorney, Agent, or Firm* — Harness, Dickey & Pierce, P.L.C.

(57) ABSTRACT

The present application discloses a bendable structure for an electronic device, which includes a first structural layer and a second structural layer arranged to be overlapped with the first structural layer. The bendable structure has a straight state and a bent state, the first structural layer has a first bendable section which can be bent, and the second structural layer has a second bendable section which can be bent. The first bendable section corresponds to the second bendable section in an overlapped manner. When the bendable structure is in the bent state, a central angle corresponding to the first bendable section and a central angle corresponding to the second bendable section are same, such that both ends of the first bendable section are flush with corresponding ends of the second bendable section.

18 Claims, 3 Drawing Sheets

(56) References Cited

U.S. PATENT DOCUMENTS

| | | | | |
|---|---|---|---|---|
| 2010/0232100 A1* | 9/2010 | Fukuma | ................... | F16G 13/18 |
| | | | | 361/679.01 |
| 2012/0307423 A1* | 12/2012 | Bohn | .................... | G06F 1/1641 |
| | | | | 361/679.01 |
| 2014/0123436 A1* | 5/2014 | Griffin | ................ | H04M 1/0216 |
| | | | | 16/221 |
| 2014/0196254 A1* | 7/2014 | Song | ......................... | E05D 3/14 |
| | | | | 16/302 |
| 2015/0077917 A1* | 3/2015 | Song | .................... | G06F 1/1681 |
| | | | | 361/679.27 |
| 2015/0131222 A1* | 5/2015 | Kauhaniemi | ......... | G06F 1/1652 |
| | | | | 361/679.27 |
| 2015/0277506 A1* | 10/2015 | Cheah | ................... | G06F 1/1681 |
| | | | | 361/679.27 |
| 2015/0378391 A1* | 12/2015 | Huitema | ................ | G06F 1/163 |
| | | | | 361/679.03 |
| 2016/0014919 A1* | 1/2016 | Huitema | ............... | G06F 1/1652 |
| | | | | 313/511 |
| 2016/0357222 A1* | 12/2016 | Seo | ....................... | G06F 1/1652 |
| 2016/0362918 A1* | 12/2016 | Song | ........................ | E05D 1/00 |
| 2016/0370828 A1* | 12/2016 | Hsu | ...................... | G06F 1/1652 |
| 2016/0370829 A1* | 12/2016 | Hsu | ...................... | G06F 1/1652 |
| 2017/0048996 A1* | 2/2017 | Han | ..................... | H05K 5/0217 |

\* cited by examiner

BENDABLE STRUCTURE AND ELECTRONIC DEVICE

This application claims the benefit of priority to Chinese Patent Application No. 201510501277.7 titled "BENDABLE STRUCTURE AND ELECTRONIC DEVICE", filed with the Chinese State Intellectual Property Office on Aug. 14, 2015, the entire disclosure of which is incorporated herein by reference.

TECHNICAL FIELD

The present application relates to the technical field of mechanical industry, in particular to a bendable structure, and further to an electronic device having the bendable structure.

BACKGROUND

With the development of the society, a flexible electronic device has been used more and more widely in people's life and production.

Figure 1:
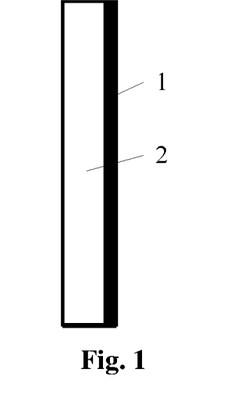
FIG. 1 is a schematic view showing the structure of a bendable structure in a straight state in the conventional art.
Figure 2:
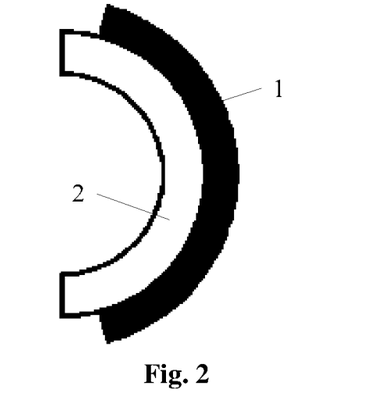
FIG. 2 is a schematic view showing the structure of the bendable structure in a bent state in the conventional art.

Reference is made to FIGS. 1 to 2. The flexible electronic device includes a two-layer structure, and the two structural layers are overlapped with each other. When the flexible electronic device is in a straight state, the two structural layers have a same length, as shown in FIG. 1; and when the flexible electronic device is in a bent state, as shown in FIG. 2, the two structural layers are in an arc-shaped state and correspond to a same center of a circle. However, the radiuses corresponding to the two structural layers are different, thus central angles corresponding to the two structural layers with the same arc length are different, and the ends of the two structural layers are not flush with each other. Thus, a case of the flexible electronic device will definitely bear against two protruding ends of an inner structural layer 2, which causes the ends of an outer layer 1 to slide relative to the case, making them difficult to be secured, and even affecting the lifetime of the electronic device.

From the above, the problem to be solved presently by the person skilled in the art is how to solve a problem in the conventional art that the ends of the two structural layers overlapped with each other are not flush with each other in the case that the two structural layers are changed into the bent state, which may otherwise causes the ends of the outer layer and the case to slide relative to each other, and further makes them difficult to be secured.

SUMMARY

In view of this, a bendable structure is provided by the present application. When the bendable structure is in a bent state, a central angle corresponding to a first bendable section of a first structural layer and a central angle corresponding to a second bendable section of a second structural layer are same, that is, both ends of the first bendable section are flush with corresponding ends of the second bendable section, thus ensuring that the two structural layers and a case do not slide relative to each other, which facilitates the two structural layers being secured to the case respectively. An electronic device is further provided by the present application. The electronic device employs the bendable structure, and the bendable structure may be secured to the case conveniently and reliably.

A technical solution is provided by the present application hereinafter.

A bendable structure configured for an electronic device, including: a first structural layer; a second structural layer arranged to be overlapped with the first structural layer; wherein the bendable structure has a straight state and a bent state, the first structural layer has a first bendable section capable of being bent, and the second structural layer has a second bendable section capable of being bent, and the first bendable section corresponds to the second bendable section in an overlapped manner; when the bendable structure is in the bent state, a central angle corresponding to the first bendable section and a central angle corresponding to the second bendable section are same.

In the bendable structure, the length of the first bendable section remains unchanged, and the length of a side of the second bendable section away from the first structural layer varies with the state of the bendable structure correspondingly.

In the bendable structure, the second bendable section includes a movable joint set, the movable joint set includes multiple movable joints connected successively.

In the bendable structure, the movable joint set includes:
a first movable joint provided with a pin;
a second movable joint provided with an arc-shaped groove; and
an intermediate movable joint provided with a pin and an arc-shaped groove;
the intermediate movable joint is located between the first movable joint and the second movable joint, and the intermediate movable joint is engaged with two adjacent movable joints, respectively, through the pin and the arc-shaped groove of the intermediate movable joint.

In the bendable structure, when the bendable structure is changed to the bent state from the straight state, each movable joint of the movable joint set turns successively.

In the bendable structure, the movable joint set includes a linkage mechanism, which enables all the movable joints of the movable joint set to turn simultaneously during the state changing of the bendable structure.

In the bendable structure, centers corresponding to the arc-shaped grooves of the second movable joint and the intermediate movable joint are respectively located at the first structural layer.

In the bendable structure, when the bendable structure is in the bent state, a center corresponding to the second bendable section is located at a side of the second structural layer away from the first structural layer.

An electronic device includes the bendable structure according to any item in the technical solution described above, wherein the first structural layer is a screen component layer.

A bendable structure for an electronic device is provided by the present application. The bendable structure includes a first structural layer and a second structural layer arranged to be overlapped with the first structural layer, wherein the bendable structure has a straight state and a bent state, the first structural layer has a first bendable section capable of being bent, and the second structural layer has a second bendable section capable of being bent, the first bendable section corresponds to the second bendable section in an overlapped manner. When the bendable structure is in the bent state, a central angle corresponding to the first bendable section and a central angle corresponding to the second bendable section are same.

When the bendable structure according to the present application is in the bent state, the central angle corresponding to a first bendable section of a first structural layer and the central angle corresponding to a second bendable section of a second structural layer are same, that is, both ends of the first bendable section are flush with corresponding ends of the second bendable section, thus ensuring that the ends of the two structural layers are flush with each other as the bendable structure is in the bent state, preventing the two structural layers and a case from sliding relative to each other, which facilitates the two structural layers being secured to the case respectively.

An electronic device is further provided by the present application. The electronic device employs the bendable structure described above and the bendable structure may be secured to the case conveniently and reliably.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for the person skilled in the art, other drawings may be obtained based on the provided drawings without any creative efforts.

| Reference numerals in FIGS. 3 to 7: | |
|---|---|
| 200 second structural layer, | 210 second bendable section, |
| 211 first movable joint, | 212 second movable joint, |
| 213 intermediate movable joint, | 2131 guiding control part, |
| 2132 sliding groove body part, | 221 first mounting block, |
| 222 second mounting block, | 223 intermediate mounting block. |

DETAILED DESCRIPTION

An embodiment of the present application discloses a bendable structure. When the bendable structure is in a bent state, a central angle corresponding to a first bendable section of a first structural layer and a central angle corresponding to a second bendable section of a second structural layer are same, that is, both ends of the first bendable section are flush with corresponding ends of the second bendable section, thus leading the two structural layers and a case not to slide relative to each other, which facilitates the two structural layers being secured to the case respectively. The present application further discloses an electronic device, which includes the bendable structure, and the bendable structure may be secured to the case conveniently and reliably.

The technical solutions in the embodiments of the present application will be described clearly and completely hereinafter in conjunction with the drawings in the embodiments of the present application. Apparently, the described embodiments are only a part of the embodiments of the present application, rather than all embodiments. Based on the embodiments in the present application, all of other embodiments, made by the person skilled in the art without any creative efforts, fall into the protection scope of the present application.

Reference is made to FIGS. 3 to 7. A bendable structure is provided by the embodiment of the present application, which is applied to an electronic device, including a first structural layer and a second structural layer 200; the second structural layer 200 is arranged to be overlapped with the first structural layer. The bendable structure has a straight state and a bent state. The first structural layer has a first bendable section which can be bent, and the second structural layer 200 has a second bendable section 210 which can be bent. The first bendable section corresponds to the second bendable section 210 in an overlapped manner. When the bendable structure is in the straight state, the first bendable section and the second bendable section 210 corresponding to the first bendable section in an overlapped manner have a same length, and the ends of the first bendable section and the second bendable section 210 are flush with each other. When the bendable structure is in the bent state, a central angle corresponding to the first bendable section and a central angle corresponding to the second bendable section 210 which corresponds to the first bendable section in an overlapped manner are same, that is, both ends of the first bendable section are flush with corresponding ends of the second bendable section 210.

In the bendable structure according to the present embodiment, the first bendable section is arranged to be overlapped with the second bendable section 210, and when the bendable structure is in the straight state, the first bendable section and the second bendable section 210 corresponding to the first bendable section have the same length, and the ends of the first bendable section and the second bendable section are flush with each other, such that both ends of the first structural layer are flush with corresponding ends of the second structural layer 200; when the bendable structure is in the bent state, the central angle corresponding to the first bendable section and the central angle corresponding to the second bendable section 210 are same, which allows the ends of the first bendable section and the second bendable section 210 to be flush with each other, that is, both ends of the first structural layer are flush with corresponding ends of the second structural layer 200 respectively, such that the ends of the two structural layers and the case of the electronic device do not slide relative to each other, which facilitates the two structural layers being secured to the case of the electronic device respectively.

In the bendable structure, the length of the first bendable section remains unchanged, and the length of a side of the second bendable section 210 away from the first structural layer varies with the state of the bendable structure correspondingly. When the bendable structure is in the straight state, the length of the side of the second bendable section 210 away from the first structural layer is the longest; when the bendable structure is in the bent state, the length of the side of the second bendable section 210 away from the first structural layer is the shortest; and during the changing of the bendable structure into the bent state from the straight state, the side of the second bendable section 210 away from the first structural layer is getting shorter, and both ends of the second bendable section 210 are always flush with corresponding ends of the first bendable section which corresponds to the second bendable section 210.

The second bendable section 210 can be made of a material which is able to be stretched, or according to the requirement to the stiffness of the electronic device, the second bendable section 210 can include a constituting section which can be only bent into an arc shape and a constituting section (such as a rubber constituting section) which can be not only stretched but also bent into an arc shape. Apparently, for meeting the requirement to the stiffness and strength of the electronic device, the second bendable section 210 includes a movable joint set, which includes multiple movable joints connected successively.

Figure 3:
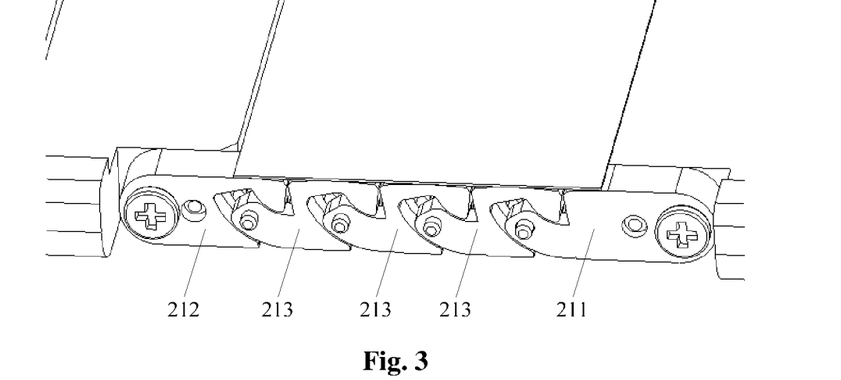
FIG. 3 is a schematic view showing the structure of an movable joint set as a bendable structure is in the straight state according to an embodiment of the present application.
Figure 4:
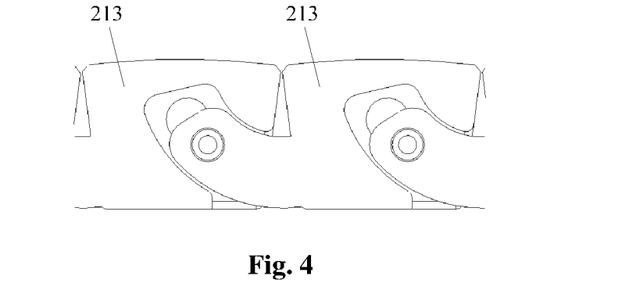
FIG. 4 is a schematic view showing the detailed structure of an intermediate movable joint in the movable joint set in FIG. 3.
Figure 5:
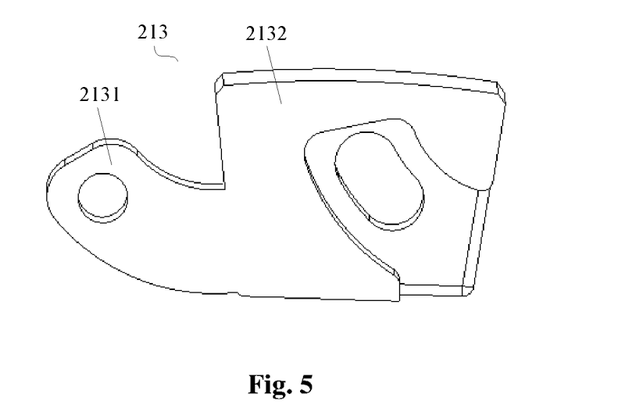
FIG. 5 is a schematic view showing the structure of the intermediate movable joint according to the embodiment of the present application.

The movable joint set may include multiple arc-shaped telescopic joints nested to each other. The movable joint set includes:

a first movable joint 211 provided with a pin;

a second movable joint 212 provided with an arc-shaped groove; and an intermediate movable joint 213 provided with a pin and an arc-shaped groove, wherein the intermediate movable joint 213 is located between the first movable joint 211 and the second movable joint 212, and the intermediate movable joint 213 is engaged with two adjacent movable joints through the pin and the arc-shaped groove of the intermediate movable joints 213, in which the pin may only slide in the arc-shaped groove engaged with the pin along the arc-shaped groove.

Specifically, if only one intermediate movable joint 213 is provided, the pin of the first movable joint 211 is engaged into the arc-shaped groove of the intermediate movable joint, and the pin of the intermediate movable joint 213 is engaged into the arc-shaped groove of the second movable joint 212.

If multiple intermediate movable joints 213 are provided, adjacent intermediate movable joints 213 are connected successively through the engagement of the pin with the arc-shaped groove, which forms the intermediate movable joint set. The pin of the first movable joint 211 is engaged into the arc-shaped groove at a first end of the intermediate movable joint set, and the pin at a second end of the intermediate movable joint set is engaged into the arc-shaped groove of the second movable joint 212.

In the embodiment, when the bendable structure is in the straight state, the pin abuts against the first end of the arc-shaped groove; and when the bendable structure is changed to the bent state from the straight state, the second bendable section 210 suffers a force and the second bendable section 210 begins to bend from the ends, causing the movable joints in the movable joint set to be turned successively. Specifically, three turning situations are as follows.

① If a bending force is applied on a first end of the movable joint, the first movable joint 211 first turns until the pin of the first movable joint 211 abuts against a second end of the arc-shaped groove of the intermediate movable joint 213 adjacent to the first movable joint 211, then the first movable joint 211 and the intermediate movable joint 213 turn together until the pin of the intermediate movable joint 213 abuts against a second end of the arc-shaped groove engaged with the pin; this process is repeated until the pin of the intermediate movable joint 213 adjacent to the second movable joint 212 abuts against a second end of the arc-shaped groove of the second movable joint 212.

② If the bending force is applied on a second end of the movable joint, the second movable joint first turns until the second end of the arc-shaped groove of the second movable joint 212 abuts against the pin of the intermediate movable joint 213 engaged with the second movable joint 212, then the second movable joint 212 and the intermediate movable joint 213 turn together; this process is repeated until the second end of the arc-shaped groove of the intermediate movable joint 213 adjacent to the first movable joint 211 abuts against the pin of the first movable joint 211.

③ If the bending force is applied on both the first end and the second end of the movable joint, as the situations in ① and ② described above, the movable joints at both ends of the movable joint set respectively turn successively until the pin of the intermediate movable joint abuts against the second end of the arc-shaped groove of the movable joint adjacent the intermediate movable joint and the second end of the arc-shaped groove of the intermediate movable joint 213 abuts against the pin of the other movable joint adjacent to the intermediate movable joint.

Specifically, in the bendable structure according to the embodiment, the movable joint set further includes a linkage mechanism. The linkage mechanism enables all the movable joints in the movable joint set to be turned simultaneously during the state changing of the bendable structure. The linkage mechanism may include a head connector, a tail connector and an intermediate connector. The head connector is fixed on the first movable joint 211, the tail connector is fixed on the second movable joint 212, and the intermediate connector is fixed on the intermediate movable joint 213. Further, each intermediate movable joint 213 is fixed with an intermediate connector thereon. The head connector is provided with a hook, the tail connector is provided with a sliding groove, and the intermediate connector is provided with a hook and a sliding groove. The head connector, the intermediate connector and the tail connector are connected successively through the engagement of the hook with the sliding groove. As the state of the bendable structure changes, the first movable joint 211 turns relative to the second movable joint 212, and the first movable joint 211 allows the head connector to turn, such that the hook of the head connector slides along the sliding groove of the intermediate connector engaged with the head connector and thus allows the intermediate connector to turn, which allows another connector engaged with the intermediate connector to turn at the same time, in this way, the connectors turn simultaneously, that is, all the movable joints turn simultaneously.

Apparently, the movement of each of the movable joints in the movable joint set is varied during the state changing of the bendable structure, which will not be limited by the present embodiment, and it only needs to ensure that both ends of the second bendable section are always flush with corresponding ends of the first bendable section which corresponds to the second bendable section.

In the bendable structure according to the embodiment, a center corresponding to the arc-shaped groove of each of the movable joints in the movable joint set is located at the first structural layer. When the state of the bendable structure is changing, the turning of each movable joint is around the center of the corresponding arc-shaped groove, that is, each movable joint turns around the center located at the first structural layer, which ensures that both ends of the second bendable section 210 are always flush with corresponding ends of the first bendable section during the state changing of the bendable structure. Specifically, multiple arc-shaped grooves of the movable joints have the same shape and size.

In the bendable structure described above, as shown in FIG. 5, the intermediate movable joint 213 includes a guiding control part 2131 and a sliding groove body part 2132. The guiding control part 2131 is a sector structure and is fixedly connected to the sliding groove body part 2132. A pin is provided at a free end of the guiding control part 2131. The sliding groove body part 2132 is provided with an arc-shaped guiding groove which is engaged with the guiding control part 2131 of another movable joint, and the arc-shaped groove of the intermediate movable joint 213 is communicated with the arc-shaped guide groove. Correspondingly, the first movable joint 211 is provided with a same guiding control part 2131 with the guiding control part 2131 of the intermediate movable joint 213, and the second movable joint 212 is provided with a same guiding groove body part 2132 with the guiding groove body part 2132 of the intermediate movable joint 213. After each of the movable joints is assembled into the movable joint set, the guiding control part 2131 is engaged into the arc-shaped guiding groove and the pin is engaged into the arc-shaped groove, such that the corresponding movable joints can only turn in an extension direction of the arc-shaped groove, which ensures that each movable joint in the movable joint set turns along a preset track, thus preventing the second bendable section 210 from being separated from the first bendable section during the state changing of the bendable structure. When the bendable structure is in the bent state, an end of the guiding control part 2131 abuts against an end of the arc-shaped guiding groove.

Specifically, when the bendable structure according to the embodiment is in the bent state, a center corresponding to the second bendable section 210 is located at a side of the second structural layer 200 away from the first structural layer.

In addition, in the bendable structure described above, the first bendable section may be provided as one section, and may also be provided as multiple sections according to the actual requirement of the electronic device. Correspondingly, the second bendable section 210 may be provided to have a same number of sections with the first bendable section, and each of the second bendable sections 210 corresponds to different first bendable sections in an overlapped manner.

Figure 6:
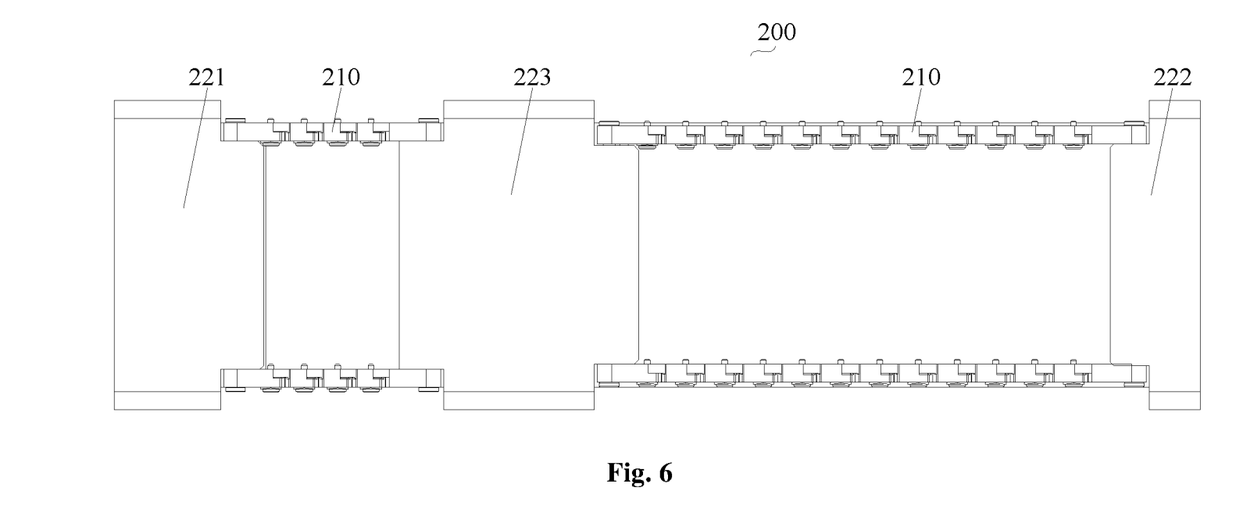
FIG. 6 is a schematic front view showing the structure of a second structural layer according to the embodiment of the present application.
Figure 7:
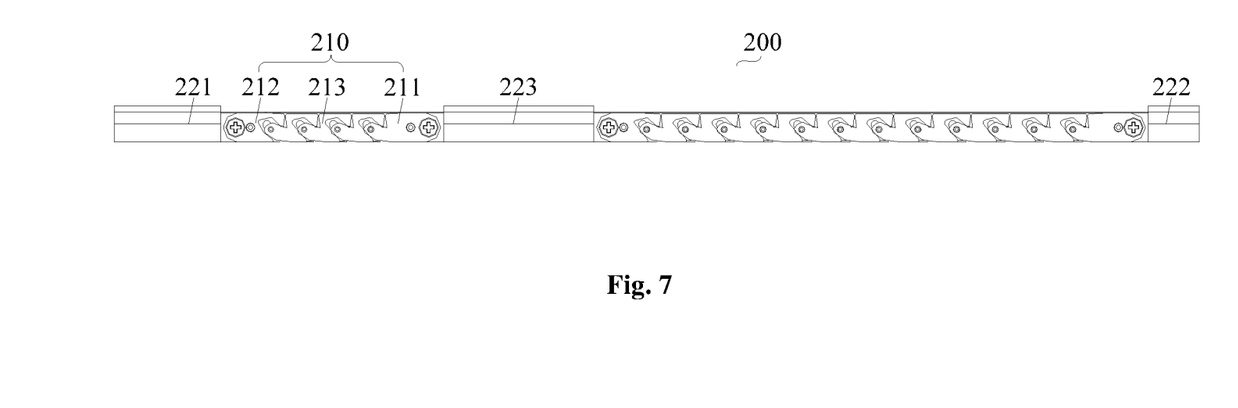
FIG. 7 is a schematic side view showing the structure of the second structural layer according to the embodiment of the present application.

Reference is made to FIG. 6. A second structural layer 200 is provided by the present embodiment. The second structural layer 200 includes a first mounting block 221, a second mounting block 222 and an intermediate mounting block 223. Specifically, the intermediate mounting block 223 is connected to the first mounting block 221 through a second bendable section 210, the first movable joint 211 of the second bendable section 210 is securely connected to the intermediate mounting block 223, and the second movable joint 212 of the second bendable section 210 is securely connected to the first mounting block 221; the intermediate mounting block 223 is securely connected to the second mounting block 222 through another second bendable section 210. The first movable joint 211 of the second bendable section 210 is securely connected to the second mounting block 222, and the second movable joint 212 of the second bendable section 210 is securely connected to the intermediate mounting block 223. The first mounting block 221 and the second mounting block 222 are configured to be securely connected to the case of the electronic device respectively.

It could be appreciated by the person skilled in the art that when the bendable structure according to the embodiment is in the bent state, the first bendable section may have an arc but non circular-arc structure, correspondingly, the first bendable section and the second bendable section do not have a corresponding central angle. It only needs to make both ends of the first bendable section to be flush with corresponding ends of the second bendable section 210, and the problem of the friction and inconvenient securing of the ends of the first structural layer with the case of the electronic device can be solved. Further, during the state changing of the bendable structure, both ends of the first bendable section are always flush with corresponding ends of the second bendable section 210.

An electronic device is further provided by an embodiment of the present application. The electronic device includes the bendable structure according to the embodiment, and the first structural layer is a screen component layer.

The electronic device employs the bendable structure described above, such that both ends of the screen component layer and the second structural layer 200 can be securely connected to the case of the electronic device. Apparently, other effects of the bendable structure according to the embodiment described above are also included in the electronic device according to the present embodiment, which will not be repeated herein.

Specifically, in the electronic device described above, the bendable structure further includes a screen supporting structural layer, which is sandwiched between the screen component layer and the second structural layer 200.

The above embodiments are described in a progressive manner. Each of the embodiments is mainly focused on describing its differences from other embodiments, and references may be made among these embodiments with respect to the same or similar portions among these embodiments.

Based on the above description of the disclosed embodiments, the person skilled in the art is capable of carrying out or using the present application. It is obvious for the person skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

The invention claimed is:

1. A bendable structure for an electronic device, comprising:
    a first structural layer; and
    a second structural layer arranged to be overlapped with the first structural layer, wherein:
    the bendable structure has a straight state and a bent state, the first structural layer has a first bendable section capable of being bent, the second structural layer has a second bendable section capable of being bent, and the first bendable section corresponds to the second bendable section in an overlapped manner;
    when the bendable structure is in the bent state, a first central angle corresponding to the first bendable section and a second central angle corresponding to the second bendable section are same; and
    the bendable structure further comprises a movable joint set, wherein the movable joint set comprises:
        a first movable joint having a first guiding control part, wherein the first guiding control part is in a sector structure and provided with a first pin;

a plurality of intermediate movable joints each having a second guiding control part, a sliding groove body part, and a second pin, wherein
the sliding groove body part is provided with a first arc-shaped guiding groove for cooperating with the first guiding control part or the second guiding control part in other movable joints, and
a slotted hole is provided at the bottom of the first arc-shaped guiding groove for accommodating the first pin or the second pin; and
a second movable joint provided with a second arc-shaped guiding groove, wherein
the plurality of intermediate movable joints is located between the first movable joint and the second movable joint, and each of the plurality of intermediate movable joints is coupled to two adjacent movable joints respectively through the corresponding pin and the corresponding arc-shaped guiding groove.

2. The bendable structure according to claim 1, wherein the length of the first bendable section remains unchanged, and the length of a side of the second bendable section away from the first structural layer varies with the state of the bendable structure correspondingly.

3. The bendable structure according to claim 2, wherein the second bendable section comprises the movable joint set, which comprises a plurality of movable joints connected successively.

4. The bendable structure according to claim 1, wherein when the bendable structure is changed to the bent state from the straight state, the movable joints of the movable joint set turn successively.

5. The bendable structure according to claim 1, wherein the movable joint set comprises a linkage mechanism, and the linkage mechanism allows all the movable joints of the movable joint set to turn simultaneously when the state of the bendable structure is changed.

6. The bendable structure according to claim 1, wherein centers corresponding to the arc-shaped grooves of the second movable joint and the intermediate movable joint are respectively located at the first structural layer.

7. The bendable structure according to claim 1, wherein when the bendable structure is in the bent state, a center corresponding to the second bendable section is located at a side of the second structural layer away from the first structural layer.

8. The bendable structure according to claim 2, wherein when the bendable structure is in the bent state, a center corresponding to the second bendable section is located at a side of the second structural layer away from the first structural layer.

9. The bendable structure according to claim 3, wherein when the bendable structure is in the bent state, a center corresponding to the second bendable section is located at a side of the second structural layer away from the first structural layer.

10. The bendable structure according to claim 1, wherein when the bendable structure is in the bent state, a center corresponding to the second bendable section is located at a side of the second structural layer away from the first structural layer.

11. The bendable structure according to claim 4, wherein when the bendable structure is in the bent state, a center corresponding to the second bendable section is located at a side of the second structural layer away from the first structural layer.

12. The bendable structure according to claim 5, wherein when the bendable structure is in the bent state, a center corresponding to the second bendable section is located at a side of the second structural layer away from the first structural layer.

13. The bendable structure according to claim 6, wherein when the bendable structure is in the bent state, a center corresponding to the second bendable section is located at a side of the second structural layer away from the first structural layer.

14. An electronic device, comprising:
a bendable structure which comprises a first structural layer; and
a second structural layer arranged to be overlapped with the first structural layer, wherein
the bendable structure has a straight state and a bent state,
the first structural layer has a first bendable section capable of being bent,
the second structural layer has a second bendable section capable of being bent,
and the first bendable section corresponds to the second bendable section in an overlapped manner;
when the bendable structure is in the bent state, a first central angle corresponding to the first bendable section and a second central angle corresponding to the second bendable section are same, wherein the first structural layer is a screen component layer; and
the bendable structure further comprises a movable joint set, wherein the movable joint set comprises:
a first movable joint having a first guiding control part, wherein the first guiding control part is in a sector structure and provided with a first pin;
a plurality of intermediate movable joints each having a second guiding control part, a sliding groove body part and a second pin, wherein
the sliding groove body art is provided with a first arc-shaped guiding groove for cooperating with the first guiding control part or the second guiding control part in other movable joints, and
a slotted hole is provided in the bottom of the first arc-shaped guiding groove for accommodating the first pin or the second pin: and
a second movable joint provided with a second arc-shaped guiding groove, wherein
the plurality of intermediate movable joints is located between the first movable joint and the second movable joint, and each of the intermediate movable joints is coupled to two adjacent movable joints respectively through the corresponding pin and the corresponding arc-shaped guiding groove.

15. An electronic device, comprising the bendable structure according to claim 14, wherein the length of the first bendable section remains unchanged, and the length of a side of the second bendable section away from the first structural layer varies with the state of the bendable structure correspondingly.

16. An electronic device, comprising the bendable structure according to claim 15, wherein the second bendable section comprises the movable joint set, which comprises a plurality of movable joints connected successively.

17. An electronic device, comprising the bendable structure according to claim 14, wherein when the bendable structure is changed to the bent state from the straight state, the movable joints of the movable joint set turn successively.

18. An electronic device, comprising the bendable structure according to claim 14, wherein the movable joint set comprises a linkage mechanism, and the linkage mechanism allows all the movable joints of the movable joint set to turn simultaneously when the state of the bendable structure is changed.

* * * * *